(12) United States Patent
Yeh et al.

(10) Patent No.: US 10,529,723 B2
(45) Date of Patent: Jan. 7, 2020

(54) LAYOUT PATTERN FOR STATIC RANDOM ACCESS MEMORY

(71) Applicant: UNITED MICROELECTRONICS CORP., Hsin-Chu (TW)

(72) Inventors: Shu-Wei Yeh, Taichung (TW); Tsung-Hsun Wu, Kaohsiung (TW); Chih-Ming Su, Tainan (TW); Yu-Tse Kuo, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/186,548

(22) Filed: Jun. 20, 2016

(65) Prior Publication Data

US 2017/0323894 A1    Nov. 9, 2017

(30) Foreign Application Priority Data

May 4, 2016  (TW) .............................. 105113803 A

(51) Int. Cl.
*H01L 27/11*  (2006.01)
*H01L 27/02*  (2006.01)

(52) U.S. Cl.
CPC ...... *H01L 27/1104* (2013.01); *H01L 27/0207* (2013.01)

(58) Field of Classification Search
CPC ................ H01L 27/11; H01L 27/0207; H01L 29/42376; H01L 29/42372; H01L 27/1104; H01L 27/0924
See application file for complete search history.

(56) References Cited

U.S. PATENT DOCUMENTS

| 6,535,453 B2* | 3/2003 | Nii | G11C 7/18 257/E27.099 |
| 8,009,463 B2* | 8/2011 | Liaw | G11C 8/16 365/154 |
| 8,675,397 B2* | 3/2014 | Liaw | G11C 8/16 365/154 |
| 9,036,404 B2* | 5/2015 | Liaw | G11C 11/412 365/154 |
| 9,099,172 B2* | 8/2015 | Liaw | G11C 8/16 |

(Continued)

FOREIGN PATENT DOCUMENTS

| CN | 103022039 A | 4/2013 |
| CN | 104022116 A | 9/2014 |

(Continued)

*Primary Examiner* — Cuong Q Nguyen
*Assistant Examiner* — Shih Stun A Chou
(74) *Attorney, Agent, or Firm* — Winston Hsu

(57) ABSTRACT

A layout pattern of a static random access memory includes a pull-up device, a first pull-down device, a second pull-up device, a second pull-down device, a first pass gate device and a second pass gate device disposed on a substrate. A plurality of fin structures are disposed on the substrate, and the fin structures include at least one first fin structure and at least one second fin structure. A J-shaped gate structure is disposed on the substrate, including a long part, a short part and a bridge part. At least one first extending contact structure crosses over the at least one first fin structure and the at least one second fin structure, wherein the at least one first extending contact structure does not overlap with the bridge part of the J-shaped gate structure.

18 Claims, 7 Drawing Sheets

(56) References Cited

U.S. PATENT DOCUMENTS

| | | | |
|---|---|---|---|
| 9,761,302 B1* | 9/2017 | Lu | G11C 11/417 |
| 9,780,099 B1* | 10/2017 | Yeh | H01L 27/1104 |
| 2008/0263492 A1* | 10/2008 | Chuang | H01L 21/76895 |
| | | | 716/122 |
| 2009/0166743 A1* | 7/2009 | Pillarisetty | H01L 27/11 |
| | | | 257/365 |
| 2011/0018064 A1* | 1/2011 | Doornbos | H01L 27/0207 |
| | | | 257/365 |
| 2011/0026308 A1* | 2/2011 | Liaw | G11C 8/16 |
| | | | 365/154 |
| 2011/0317477 A1* | 12/2011 | Liaw | G11C 8/16 |
| | | | 365/156 |
| 2014/0131813 A1* | 5/2014 | Liaw | H01L 27/1104 |
| | | | 257/401 |
| 2014/0185365 A1* | 7/2014 | Liaw | G11C 11/419 |
| | | | 365/154 |
| 2015/0340083 A1* | 11/2015 | Liaw | G11C 11/419 |
| | | | 365/51 |

FOREIGN PATENT DOCUMENTS

| | | |
|---|---|---|
| JP | 2013-105890 A | 5/2013 |
| TW | 201601257 A | 1/2016 |
| TW | 201606942 A | 2/2016 |

\* cited by examiner

LAYOUT PATTERN FOR STATIC RANDOM ACCESS MEMORY

BACKGROUND OF THE INVENTION

1. Field of the Invention

The invention relates to a static random access memory (SRAM), and more particularly, to a SRAM having the advantages of higher yield and faster read speed.

2. Description of the Prior Art

An embedded static random access memory (SRAM) comprises a logic circuit and a static random access memory connected to the logic circuit. SRAM is a kind of volatile memory cell, which means it preserves data only while power is continuously applied. SRAM is built of cross-coupled inverters that store data during the time that power remains applied, unlike dynamic random access memory (DRAM) that needs to be periodically refreshed. Because of its high access speed, SRAM is also used in computer systems as a cache memory.

However, as pitch of the exposure process decreases, it has been difficult for the current SRAM architecture to produce desirable patterns. Hence, how to enhance the current SRAM architecture for improving exposure quality has become an important task in this field.

SUMMARY OF THE INVENTION

The present invention provides a layout pattern of a static random access memory, including: a first inverter and a second inverter cross-coupled for data storage, each inverter including at least one pull-up device (PLs) and at least one pull-down devices (PDs), at least one pass gate devices (PGs) configured with the two cross-coupled inverters, wherein each of the at least one pull-up device (PLs), the at least one pull-down devices (PDs), and the at least one pass gate devices (PGs) includes a fin field-effect transistor (FinFET), a plurality of fin structures disposed on the substrate, the fin structures includes at least one first fin structure, at least one second fin structure, at least one third fin structure and at least one fourth fin structure, each inverter comprising a J-shaped structure disposed on the substrate, the J-shaped structure comprising a long part and a short part arranged along a first direction and a bridge part arranged along a second direction, wherein the first direction is perpendicular to the second direction, wherein the long part crosses over the at least one first fin structure and the short part crosses over the at least one second fin structure to from the at least one pull-down devices (PDs), wherein the long part crosses over the at least one third fin structure to from the at least one pull-up devices (PLs), each inverter having at least one first pass gate structure disposed on the substrate, the at least one first pass gate structure and the short part of the J-shaped structure being arranged along the first direction, and the at least one first pass gate structure and the short part of the J-shaped structure comprising a same symmetry axis, wherein the at least one first pass gate structure crosses over the at least one fourth fin structure to from the pass gate devices (PGs), and a first extending contact structure crossing over the at least one first fin structure and the at least one second fin structure, wherein the first extending contact structure does not overlap with the bridge part of the J-shaped structure.

The present invention further provides a layout pattern of a static random access memory, including: a first inverter and a second inverter cross-coupled for data storage, each inverter including at least one pull-up device (PLs) and at least one pull-down devices (PDs), at least one pass gate devices (PGs) configured with the two cross-coupled inverters, wherein each of the at least one pull-up device (PLs), the at least one pull-down devices (PDs), and the at least one pass gate devices (PGs) includes a fin field-effect transistor (FinFET), a plurality of diffusion regions disposed on the substrate, the diffusion regions includes at least one first diffusion region, at least one second diffusion region, at least one third diffusion region and at least one fourth diffusion region, each inverter comprising a J-shaped structure disposed on the substrate, the J-shaped structure comprising a long part and a short part arranged along a first direction and a bridge part arranged along a second direction, wherein the first direction is perpendicular to the second direction, wherein the long part crosses over the at least one first diffusion region and the short part crosses over the at least one second diffusion region to from the at least one pull-down devices (PDs), wherein the long part crosses over the at least one third diffusion region to from the at least one pull-up devices (PLs), each inverter having at least one first pass gate structure disposed on the substrate, the at least one first pass gate structure and the short part of the J-shaped structure being arranged along the first direction, and the at least one first pass gate structure and the short part of the J-shaped structure comprising a same symmetry axis, wherein the at least one first pass gate structure crosses over the at least one fourth diffusion region to from the pass gate devices (PGs), and a first extending contact structure crossing over the at least one first diffusion region and the at least one second diffusion region, wherein the first extending contact structure does not overlap with the bridge part of the J-shaped structure.

A key feature of this embodiment is that both the long part and the short part of the J-shaped structure cross over the same fin structure. In this way, in a limited range, the gate can cross more fin structures, thereby improving the read speed of one pull-down device. Furthermore, another feature of the present invention is when viewed in a top view, the extending contact structure does not overlap with the bridge part, and there is a gap disposed therebetween. By the applicant's experiment, if the extending contact structure does not overlap with the bridge part, the parasitic capacitance can be reduced, and thereby improving the yield, and further improving the stability and speed of the SRAM.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
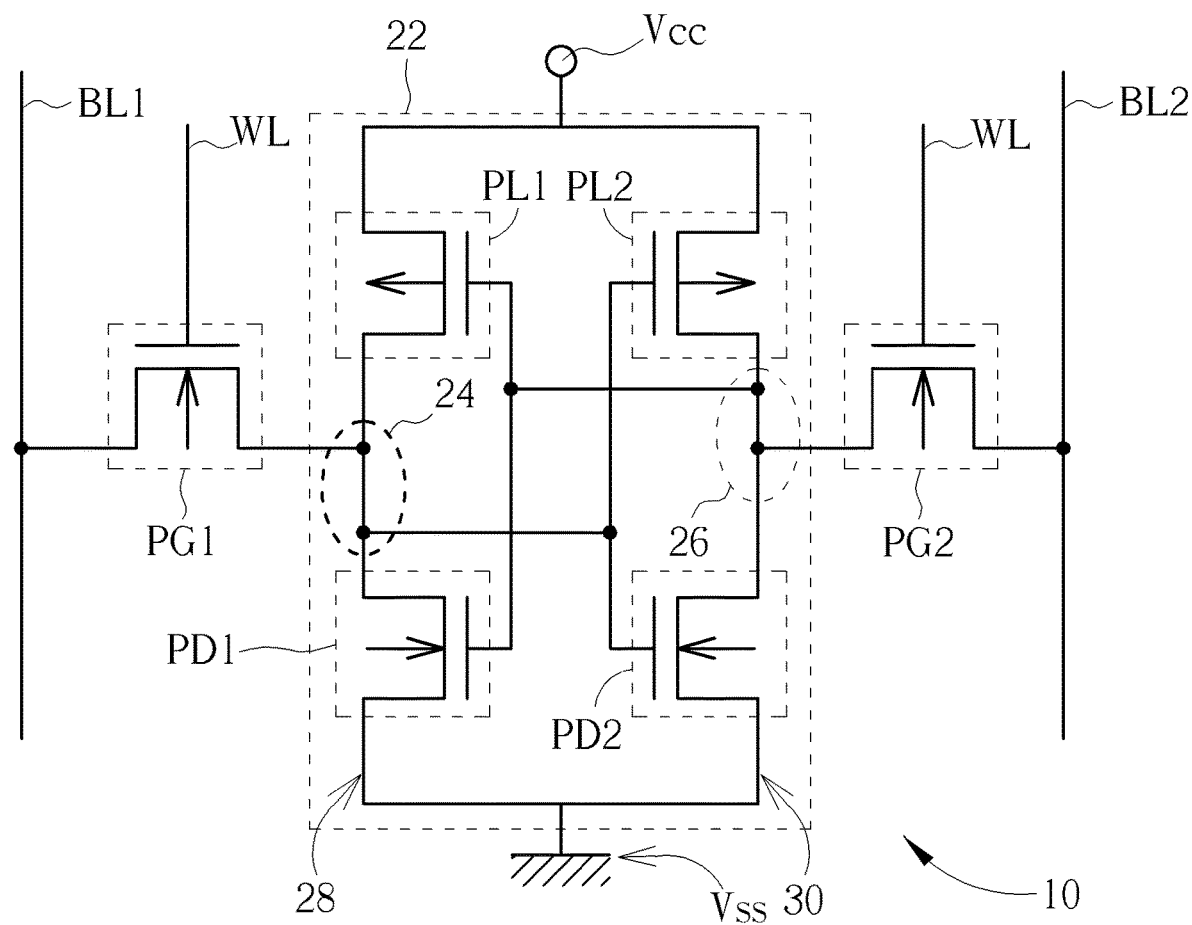
FIG. 1 illustrates a circuit diagram of a six-transistor SRAM (6T-SRAM) cell according to a first preferred embodiment of the present invention.
Figure 2:
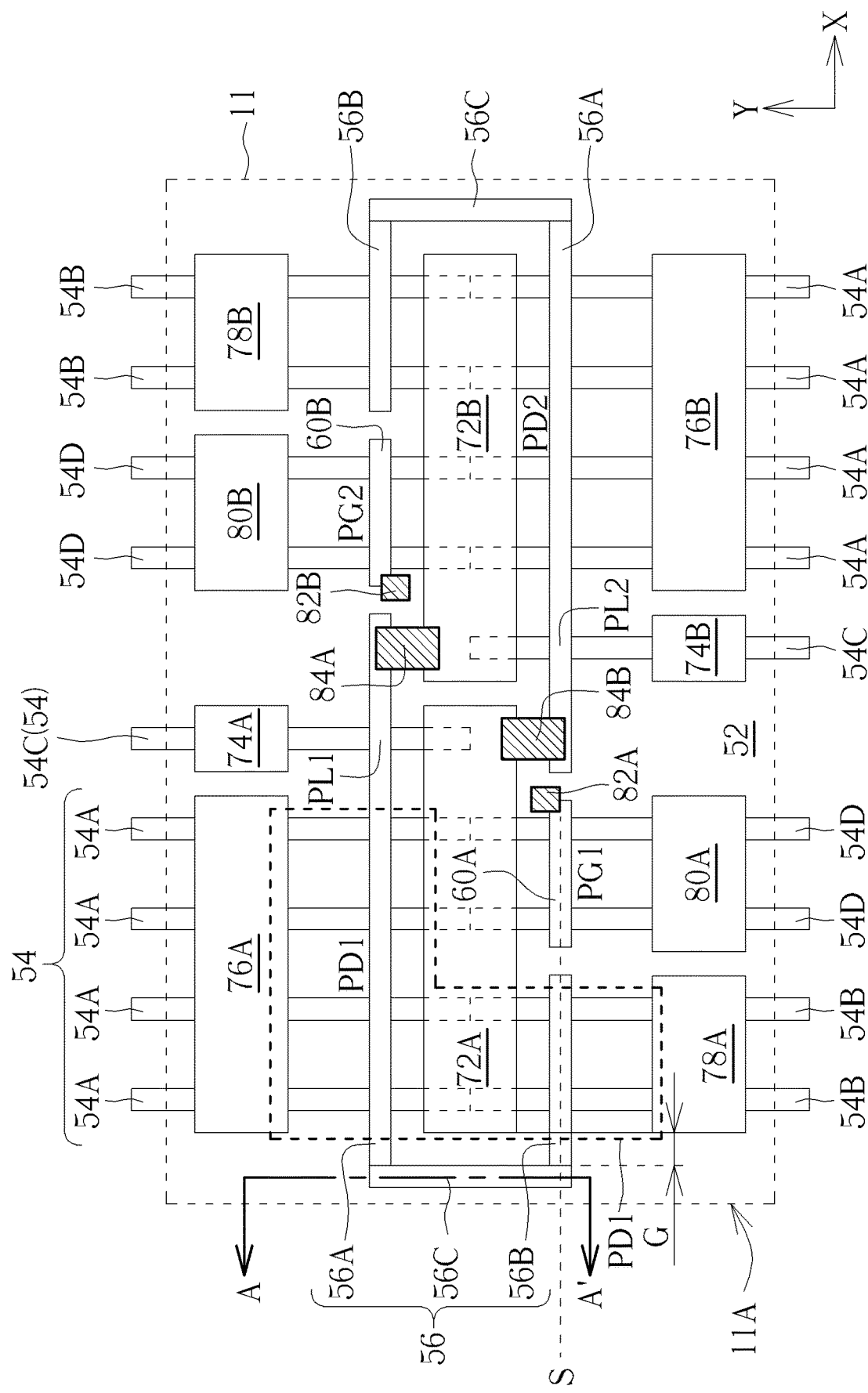
FIG. 2 illustrates a layout diagram of a 6T-SRAM according to a first preferred embodiment of the present invention.

Referring to FIGS. 1-2, FIG. 1 illustrates a circuit diagram of a six-transistor SRAM (6T-SRAM) cell according to a first preferred embodiment of the present invention, and FIG. 2 illustrates a layout diagram of a 6T-SRAM according to the first preferred embodiment of the present invention.

As shown in FIGS. 1-2, the SRAM device of the present invention preferably includes at least one SRAM cell, each SRAM cell including a six-transistor SRAM (6T-SRAM) cell 10.

In this embodiment, each 6T-SRAM cell 10 is composed of a first pull-up device PL1, a second pull-up device PL2, and a first pull-down device PD1, a second pull-down device PD2, a first pass gate device PG1 and a second pass gate device PG2. These six devices (transistors) constitute a set of flip-flops. The first and the second pull-up devices PL1 and PL2, and the first and the second pull-down devices PD1 and PD2 constitute a latch circuit 22 that stores data in the storage nodes 24 and 26. Since the first and the second pull-up devices PL1 and PL2 act as power load devices, they can be replaced by resistors. Under this circumstance, the static random access memory becomes a four-transistor SRAM (4T-SRAM). In this embodiment, the first and the second pull-up devices PL1 and PL2 preferably share a source/drain region and electrically connect to a voltage source (voltage node) Vcc, and the first and the second pull-down devices PD1 and PD2 share a source/drain region and electrically connect to a voltage source (voltage node) Vss.

Preferably, the first and the second pull-up devices PL1 and PL2 of the 6T-SRAM cell 10 are composed of p-type metal oxide semiconductor (PMOS) transistors; the first and the second pull-down devices PD1 and PD2, the first pass gate devices PG1 and the second pass gate devices PG2 composed of n-type metal oxide semiconductor (NMOS) transistors, but not limited thereto. The first pull-up device PL1 and the first pull-down device PD1 constitute an inverter, which further form a series circuit 28. One end of the series circuit 28 is connected to a voltage source Vcc and the other end of the series circuit 28 is connected to a voltage source Vss. Similarly, the second pull-up device PL2 and the second pull-down device PD2 constitute another inverter and a series circuit 30. One end of the series circuit 30 is connected to the voltage source Vcc and the other end of the series circuit 30 is connected to the voltage source Vss. The two inverters are cross-coupled to each other to storage data.

The storage node 24 is connected to the respective gates of the second pull-down device PD2 and the second pull-up device PL2. The storage node 24 is also connected to the drains of the first pull-down device PD1, the first pull-up device PL1 and the first pass gate device PG1. Similarly, the storage node 26 is connected to the respective gates of the first pull-down device PD1 and first the pull-up device PL1. The storage node 26 is also connected to the drains of the second pull-down device PD2, the second pull-up device PL2 and the second pass gate device PG2. The gates of the first pass gate device PG1 and the second pass gate device PG2 are respectively coupled to a word line (WL); the source of the first pass gate device PG1 and the second pass gate device PG2 are respectively coupled to a first bit line (BL1) and a second bit line (BL2).

In this embodiment, a 6T-SRAM cell 10 is disposed on a substrate 52, such as a silicon substrate or silicon-on-insulator (SOI) substrate. The substrate may be a planar substrate, or a plurality of fin structures 54 may be formed on the substrate 52. In this embodiment, take a 6T-SRAM with fin structures 54 as an example, but the present invention is not limited thereto. In another case, the planar SRAM (the SRAM without comprising fin structures) may also be comprised within the scope of the present invention. In addition, a shallow trench isolation (STI, not shown) is disposed between each fin structure 54.

Generally, one fin transistor includes a gate structure crossing over at least one fin structure. However, if one gate structure crosses over a plurality of paralleled arranged fin structures, in the equivalent circuit, it's equal to a plurality of transistors connected in parallel to each other, thereby helping to increase the channel width of the fin transistor, and the read current (Tread) of one fin transistor can also be improved, so as to improve the operation speed of the whole SRAM (due to one SRAM includes a plurality of fin transistors).

Therefore, one purpose of the present invention is make one gate structure cross more fin structures within a limited range, so as to improve the operation speed of the whole SRAM.

A key feature of the present invention is the invention further comprises at least two J-shaped structures 56 disposed on the substrate 52, and the two J-shaped structures 56 are symmetrically arranged. To simplify the description, this embodiment only describes one of the J-shaped structures 56 (e.g., the left J-shaped structure 56 in FIG. 2). Except for the symmetrical arrangement, the other characteristics of the two J-shaped structures 56 are completely identical.

The J-shaped structures 56 includes a long part 56A, a short part 56B and a bridge part 56C which is connected to the long part 56A and the short part 56B. More precisely, the long part 56A and the short part 56B of the J-shaped structure 56 are arranged along a first direction (such as the X-direction in FIG. 2), and the bridge part 56C of the J-shaped structure 56 is arranged along a second direction (such as the Y-direction in FIG. 2). The first direction and the second direction are preferably perpendicular to each other, but not limited thereto.

Figure 3:
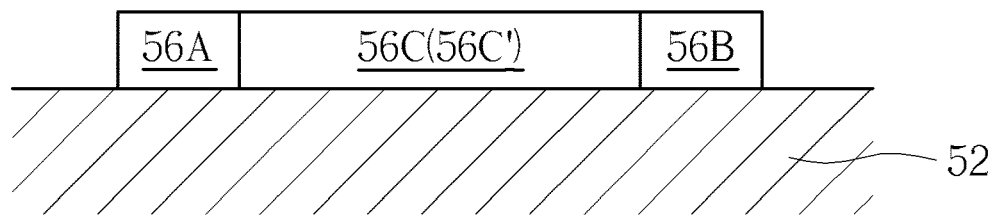
FIG. 3 shows a cross section diagram along the cross section line A-A' of FIG. 2 according to one embodiment of the present invention.
Figure 4:
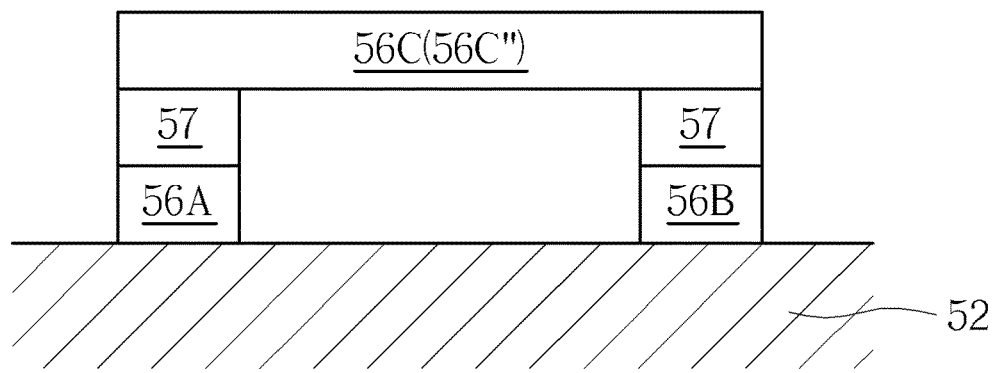
FIG. 4 shows a cross section diagram along the cross section line A-A' of FIG. 2 according to another embodiment of the present invention.

It is noteworthy that the 6T-SRAM cell 10 is disposed within a specific range 11, in other words, the specific range 11 only includes one 6T-SRAM cell 10 disposed therein. The bridge part 56C is disposed adjacent to one edge of the specific range 11 (such as the edge 11A shown in FIG. 2). In addition, FIG. 3 and FIG. 4 respectively show two cross section diagrams along the cross section line A-A' in FIG. 2 according to two embodiments of the present invention. As shown in FIG. 3, the bridge part 56C may include a high-k layer (not shown) and a metal electrode (labeled as 56C' in FIG. 3), which contacts the long part 56A and the short part 56B directly. Or in another case (not shown), the bridge part 56C, the long part 56A and the short part 56B is a monolithically formed structure. In another case, as shown in FIG. 4, the bridge part 56C may be a metal layer (labeled as 56C" in FIG. 4), which is electrically connected to the long part 56A and the short part 56B through two contact structures 57. To simplify the figure, the interlayer dielectric (ILD) is not shown in FIGS. 3-4, but it can be understood that the ILD should be disposed on the substrate 52, and each element (including the long part 56A, the short part 56B, the bridge part 56C and the contact structures 57, etc. . . . ) are disposed in the ILD.

fin structures 54. Here the fin structures 54 are labeled as the first fin structures 54A, the second fin structures 54B, the third fin structure 54C and the fourth fin structure 54D. It is noteworthy that in this embodiment, there are more than one first fin structure 54A, more than one second fin structure 54B and more than one fourth fin structure 54D, including four parallel arranged first fin structures 54A, two parallel arranged second fin structures 54B, one third fin structure 54C and two parallel arranged fourth fin structures 54D (in each one inverter). However, the amount of the first fin structures 54A, the second fin structures 54B, the third fin structure 54C and the fourth fin structure 54D may include any integer greater than or equal to 1, and it can be adjusted according to actual requirements.

In this embodiment, the long part 56A of the J-shaped structure 56 crosses over the first fin structures 54A and the third fin structure 54C, and the short part 56B of the J-shaped structure 56 crosses over the second fin structures 54B. The portion that the long part 56A crosses over the third fin structure 54C constitutes a gate of the first the pull-up device PL1. In addition, the portion that the long part 56A crosses over the first fin structures 54A, and the portion that the short part 56B crosses over the second fin structures 54B constitutes a gate of the first the pull-down device PD1 (the range of the dotted line in FIG. 2 shows the range of the first the pull-down device PD1).

Therefore, in terms of the first pull-down device PD1, which comprises the J-shaped structure 56, and the J-shaped structure 56 crosses over total six fin structures (including the long part 56A crosses four first fin structures 54A, and the short part 56B crosses two second fin structures 54B). In this way, in a limited range, the gate can cross more fin structures. This increases the channel width of the first pull-down device PD1, and the read current (Tread) of one first pull-down device PD1 can also be improved, so as to improve the read speed of the first pull-down device PD1.

Besides the J-shaped structure 56, the 6T-SRAM cell 10 also comprises two symmetrically arranged first pass gate structures 60A, 60B disposed on the substrate 52. To simplify the description, this embodiment only describes the first pass gate structures 60A (e.g., the left first pass gate structure 60A in FIG. 2). Except for the symmetrical arrangement, the other characteristics of the two first pass gate structures 60A, 60B are completely identical.

Preferably, the first pass gate structure 60A is arranged along the first direction, and it's also arranged along the extending direction of the short part 56B. In other words, the short part 56B and the first pass gate structure 60A have a same symmetry axis S. The first pass gate structure 60A crosses over the fourth fin structures 54D, to constitute the gate of the first pass gate device PG1 mentioned above. Similarly, another first pass gate structure 60B crosses over other fourth fin structures 54D, to constitute the gate of the second pass gate device PG2 mentioned above.

Besides the fin structures and the gate structures mentioned above, the 6T-SRAM cell 10 further includes a plurality of contact structures, including two symmetrically arranged extending contact structures 72A and 72B (here takes the extending contact structures 72A as an example), disposed between the long part 56A and the short part 56B of the J-shaped structure 56, and crossing over each first fin structure 54A, each second fin structure 54B, each the third fin structure 54C and each fourth fin structure 54D, to electrically connect each parallel arranged fin structure together. Please also refer to FIG. 1, where the extending contact structure 72A electrically connects to the drain of the first pull-down device PD1, the first pull-up device PL1 and the first pass gate device PG1. Besides, when viewed in a top view, the shape of the extending contact structure 72A may be a strip shape or other shapes (such as L-shaped), and the present invention is not limited thereto.

Furthermore, the other contact structures disposed on the substrate 52 include:

Two symmetrically arranged contact structures 74A, 74B, for example, the contact structure 74A electrically connected to each third fin structure 54C, and also electrically connected to the voltage source Vcc (please refer to FIG. 1, where the contact structure 74A electrically connected the source of the first pull-up device PL1 and the second pull-up device PL2 to the voltage source Vcc).

Two symmetrically arranged contact structures 76A, 76B, for example, the contact structure 76A crosses over each first fin structure 54A, and is electrically connected to the voltage source Vss (please refer to FIG. 1, where the contact structure 76A electrically connected the source of the first pull-down device PD1 and the second pull-down device PD2 to the voltage source Vss).

Two symmetrically arranged contact structures 78A, 78B, for example, the contact structure 78A crosses over each second fin structure 54B, and is electrically connected to the voltage source Vss (please refer to FIG. 1, where the contact structure 78A electrically connected the source of the first pull-down device PD1 and the second pull-down device PD2 to the voltage source Vss).

Two symmetrically arranged contact structures 80A, 80B, for example, the contact structure 80A crosses over each fourth fin structure 54D, and is electrically connected to the bit line BL1 or the bit line BL2 (please refer to FIG. 1, where the contact structure 80A electrically connected the source of the first pass gate device PG1 and the second pass gate device PG2 to the bit line BL1 and the bit line BL2 respectively).

Two symmetrically arranged contact structures 82A, 82B, for example, the contact structure 82A disposed on each first pass gate structure 60A, and electrically connected to the word line WL (please refer to FIG. 1, where the contact structure 82A electrically connected the gate of the first pass gate device PG1 and the second pass gate device PG2 to the word line WL).

Two symmetrically arranged contact structures 84A, 84B, for example, the contact structure 84A disposed on the third fin structure 54C, and electrically connected to the J-shaped structure 56 and the extending contact structure 72A (please refer to FIG. 1, where the contact structure 84A electrically connected the gate of the first pull-up device PL1 to the storage node 26, and electrically connected the gate of the second pull-up device PL2 to the storage node 24). Besides, the contact structures mentioned above are also arranged symmetrically, and will not be described again.

Furthermore, another feature of the present invention is when viewed in a top view, the extending contact structure 72A does not overlap with the bridge part 56C, and there is a gap G disposed therebetween. By the applicant's experiment, if the extending contact structure 72A does not overlap with the bridge part 56C, and the parasitic capacitance can be reduced, thereby improving the yield, and further improving the stability and speed of the SRAM.

The following description will detail the different embodiments of the SRAM of the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 5:
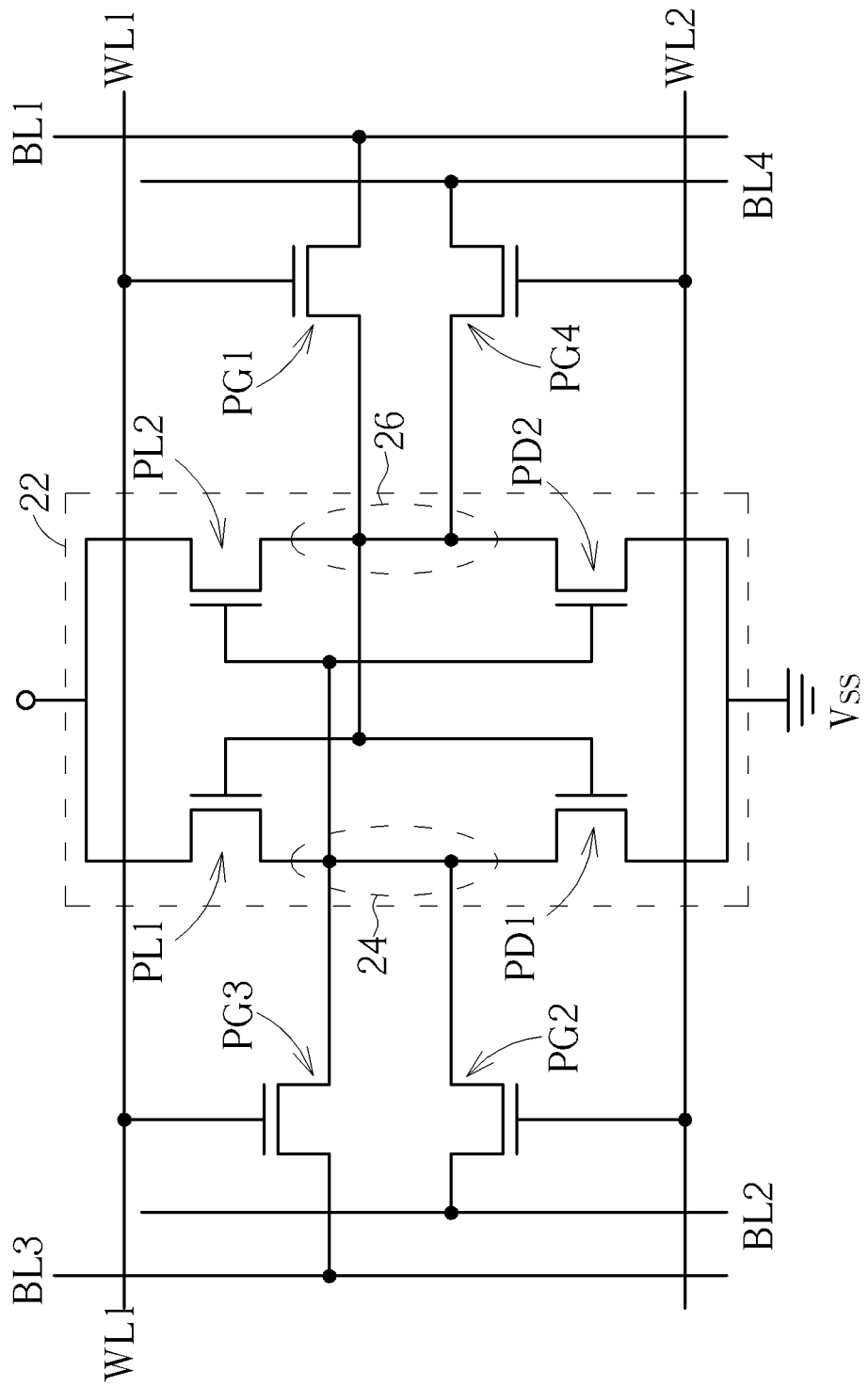
FIG. 5 illustrates a circuit diagram of an eight-transistor SRAM (8T-SRAM) cell according to a second preferred embodiment of the present invention.
Figure 6:
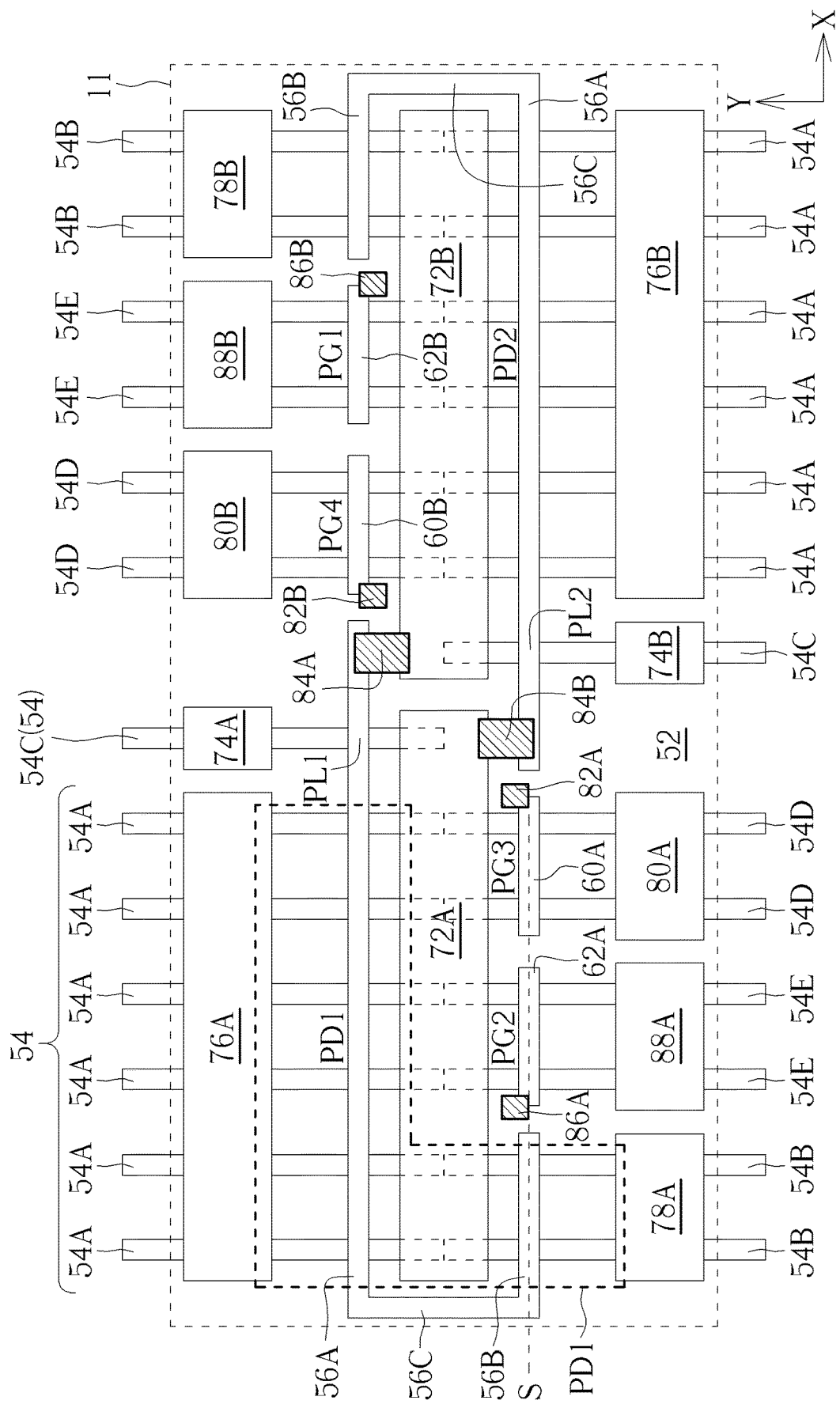
FIG. 6 illustrates a layout diagram of an 8T-SRAM according to a second preferred embodiment of the present invention.

Referring to FIGS. 5-6, FIG. 5 illustrates a circuit diagram of an eight-transistor SRAM (8T-SRAM) cell according to a second preferred embodiment of the present invention, and FIG. 6 illustrates a layout diagram of an 8T-SRAM according to the second preferred embodiment of the present invention.

As shown in FIGS. 5-6, the SRAM device of the present invention preferably includes at least one SRAM cell, each SRAM cell including an eight-transistor SRAM (8T-SRAM) cell 12.

In this embodiment, each 8T-SRAM cell 12 is composed of a first pull-up device PL1, a second pull-up device PL2, a first pull-down device PD1, a second pull-down device PD2, a first pass gate device PG1, a second pass gate device PG2, a third pass gate device PG3 and a fourth pass gate device PG4. These eight devices (transistors) constitute a set of flip-flops. The first and the second pull-up devices PL1 and PL2, and the first and the second pull-down devices PD1 and PD2 constitute a latch circuit 22 that stores data in the storage nodes 24 and 26. Since the first and the second pull-up devices PL1 and PL2 act as power load devices, they can be replaced by resistors. Under this circumstance, the static random access memory becomes a four-transistor SRAM (4T-SRAM). In this embodiment, the first and the second pull-up devices PL1 and PL2 preferably share a source/drain region and electrically connect to a voltage source (voltage node) Vcc, and the first and the second pull-down devices PD1 and PD2 share a source/drain region and electrically connect to a voltage source (voltage node) Vss.

The storage node 24 is connected to the respective gates of the second pull-down device PD2 and the second pull-up device PL2. The storage node 24 is also connected to the drains of the first pull-down device PD1, the first pull-up device PL1, the third pass gate device PG3 and the second pass gate device PG2. Similarly, the storage node 26 is connected to the respective gates of the first pull-down device PD1 and first the pull-up device PL1. The storage node 26 is also connected to the drains of the second pull-down device PD2, the second pull-up device PL2, the first pass gate device PG1 and the fourth pass gate device PG4. The gates of the first pass gate device PG1 and the third pass gate device PG3 are respectively coupled to a first word line (WL1); the gates of the second pass gate device PG2 and the fourth pass gate device PG4 are respectively coupled to a second word line (WL2); the source of the first pass gate device PG1 is coupled to a first bit line (BL1); the source of the second pass gate device PG2 is coupled to a second bit line (BL2); the source of the third pass gate device PG3 is coupled to a third bit line (BL3); and the source of the fourth pass gate device PG4 is coupled to a fourth bit line (BL4).

Please refer to FIG. 6, the layout pattern of the 8T-SRAM cell 12 and the layout pattern of the 6T-SRAM cell 10 (please refer to FIG. 2) are substantially the same, and the duplicate elements will not be described again. The difference between this embodiment and the first preferred embodiment is in this embodiment further comprising the third pass gate device PG3 and the fourth pass gate device PG4. Therefore, besides the first fin structures 54A (this embodiment includes six parallel arranged first fin structures 54A), the second fin structures 54B, the third fin structures 54C and the fourth fin structures 54D, this embodiment further comprises at least two fifth fin structures 54E (also arranged symmetrically) disposed on the substrate 52. Each fifth fin structure 54E is disposed between the second fin structure 54B and the fourth fin structure 54D. In this embodiment, the left part (or the right part) of the 8T-SRAM cell 12 has two parallel arranged fifth fin structures 54E. However, the amount of the fifth fin structure 54E may include any integer greater than or equal to 1, and it can be adjusted according to actual requirements.

The 8T-SRAM cell 12 also comprises two symmetrically arranged second pass gate structures 62A, 62B disposed on the substrate 52 (here takes the second pass gate structures 62A as an example). Preferably, the second pass gate structure 62A is arranged along the first direction, and it's also arranged along the extending direction of the short part 56B. In other words, the short part 56B and the second pass gate structure 62A have a same symmetry axis S. The second pass gate structure 62A crosses over fifth fin structure 54E, to constitute the gate of the second pass gate device PG2 and the gate of the first pass gate device PG1 mentioned above.

In addition, in this embodiment, the extending contact structure 72A is disposed between the long part 56A and the short part 56B of the J-shaped structure 56, and cross over each first fin structure 54A, each second fin structure 54B, each third fin structure 54C, each fourth fin structure 54D and each fifth fin structure 54E, to electrically connect each parallel arranged fin structure together. Please also refer to FIG. 5, where the extending contact structure 72A is electrically connected to the drain of the first pull-down device PD1, the first pull-up device PL1, the second pass gate device PG2 and the third pass gate device PG3. Besides, when viewed in a top view, the shape of the extending contact structure 72A may be a strip shape or other shapes (such as L-shaped), and the present invention is not limited thereto.

Furthermore, the other contact structures disposed on the substrate 52 including:

Two symmetrically arranged contact structures 74A, 74B, for example, the contact structure 74A electrically connected to each third fin structure 54C, and also electrically connected to the voltage source Vcc (please refer to FIG. 1, where the contact structure 74A electrically connected the source of the first pull-up device PL1 and the second pull-up device PL2 to the voltage source Vcc).

Two symmetrically arranged contact structures 76A, 76B, for example, the contact structure 76A crosses over each first fin structure 54A, and is electrically connected to the voltage source Vss (please refer to FIG. 1, where the contact structure 76A electrically connected the source of the first pull-down device PD1 and the second pull-down device PD2 to the voltage source Vss).

Two symmetrically arranged contact structures 78A, 78B, for example, the contact structure 78A crosses over each second fin structure 54B, and is electrically connected to the voltage source Vss (please refer to FIG. 1, where the contact structure 78A electrically connected the source of the first pull-down device PD1 and the second pull-down device PD2 to the voltage source Vss).

Two symmetrically arranged contact structures 80A, 80B, for example, the contact structure 80A crosses over each fourth fin structure 54D, and is electrically connected to the bit line BL1 or the bit line BL2 (please refer to FIG. 1, where the contact structure 80A electrically connected the source of the first pass gate device PG1 and the second pass gate device PG2 to the bit line BL1 and the bit line BL2 respectively).

Two symmetrically arranged contact structures 82A, 82B, for example, the contact structure 82A disposed on each first pass gate structure 60A, and electrically connected to the word line WL (please refer to FIG. 1, where the contact structure 82A electrically connected the gate of the first pass gate device PG1 and the second pass gate device PG2 to the word line WL).

Two symmetrically arranged contact structures 84A, 84B, for example, the contact structure 84A disposed on the third fin structure 54C, and electrically connected to the J-shaped structure 56 and the extending contact structure 72 (please refer to FIG. 1, where the contact structure 84A electrically connected the gate of the first pull-up device PL1 to the storage node 26, and electrically connected the gate of the second pull-up device PL2 to the storage node 24).

Two symmetrically arranged contact structures 86A, 86B, for example, the contact structure 86A disposed on each second pass gate structure 62A, and electrically connected to the word line WL2 or the word line WL1 (please refer to FIG. 5, where the contact structure 86A electrically connected the gate of the second pass gate device PG2 to the word line WL2, and electrically connected the gate of the first pass gate device PG1 to the word line WL1).

Two symmetrically arranged contact structures 88A, 88B, for example, the contact structure 88A crosses over each fifth fin structure 54E, and is electrically connected to the bit line BL1 or the bit line BL2 (please refer to FIG. 5, where the contact structure 88A electrically connected the source of the second pass gate device PG2 to the bit line BL2, and electrically connected the source of the first pass gate device PG1 to the bit line BL1 respectively). Besides, the contact structures mentioned above are also arranged symmetrically, and will not be described again.

A key feature of this embodiment is in terms of the first pull-down device PD1, which comprises the J-shaped structure 56, and the J-shaped structure 56 crosses over total eight fin structures (including the long part 56A crossing six first fin structures 54A, and the short part 56B crossing two second fin structures 54B). In this way, in a limited range, the gate can cross more fin structures. This increases the channel width of the first pull-down device PD1, and the read current (Iread) of one first pull-down device PD1 can also be improved, so as to improve the read speed of the first pull-down device PD1. Furthermore, another feature of the present invention is when viewed in a top view, the extending contact structure 72A does not overlap with the bridge part 56C, and there is a gap G disposed therebetween. By the applicant's experiment, if the extending contact structure 72A does not overlap with the bridge part 56C, the parasitic capacitance can be reduced, thereby improving the yield, and further improving the stability and speed of the SRAM.

Figure 7:
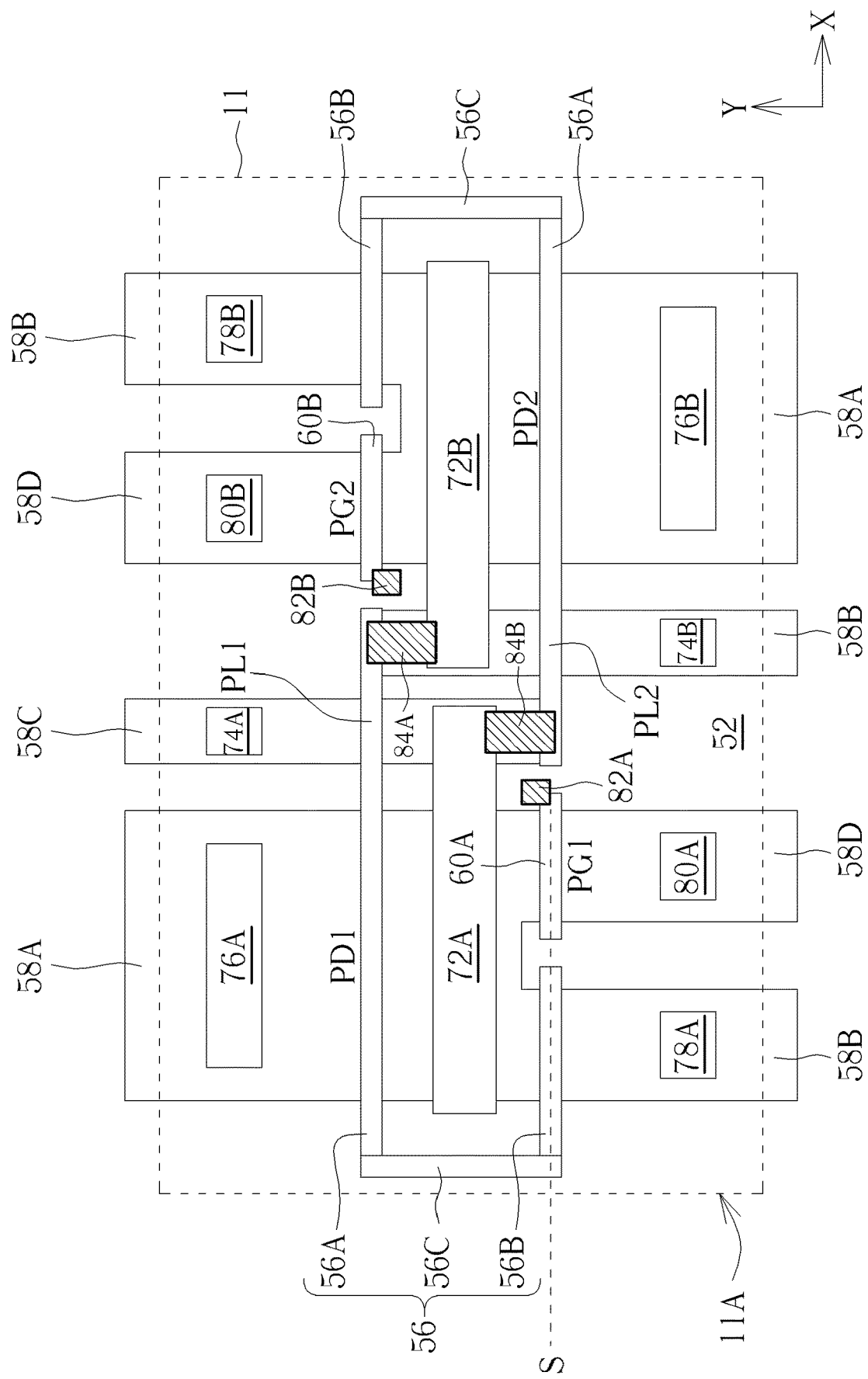
FIG. 7 illustrates a layout diagram of a 6T-SRAM according to another preferred embodiment of the present invention.

Each embodiment mentioned above includes a plurality of fin structures 54 disposed on the substrate 52. However, in another embodiment of the present invention, there are no fin structures formed on the substrate, but a plurality of diffusion regions are formed in the substrate through an ion implantation process. Next, the processes mentioned above, including forming the J-shaped structures, forming the first pass gate structures and forming the contact structures, are performed. In other words, in the following embodiment, planar transistors are used to replace the finFET mentioned above. Please refer to FIG. 7. FIG. 7 illustrates a layout diagram of a 6T-SRAM according to another preferred embodiment of the present invention. In this embodiment, the fin structures are not formed, and two symmetrically arranged first diffusion regions 58A, two symmetrically arranged second diffusion regions 58B, two symmetrically arranged third diffusion regions 58C and two symmetrically arranged fourth diffusion regions 58D are formed in the substrate 52 through an ion implantation process. Next, similar to the processes mentioned in the first preferred embodiment, the J-shaped structures 56, the first pass gate structures 60A, 60B, the extending contact structures 72A, 72B, and a plurality of contact structures (including the contact structures 74A, 74B, 76A, 76B, 78A, 78B, 80A, 80B, 82A, 82B, 84A and 84B) are formed. The J-shaped structure 56 is disposed on the first diffusion region 58A and on the second diffusion region 58B, and each first pass gate structure 60A (or 60B) is disposed on the fourth diffusion region 58D. In this embodiment, the gate of the first pull-down device PD1 includes the J-shaped structure 56, and the long part 56A of the J-shaped structure 56 is disposed on the first diffusion region 58A, the short part 56B of the J-shaped structure 56 is disposed on the second diffusion region 58B. Therefore, this embodiment has the same advantage as the one in the first preferred embodiment: the channel width of the first pull-down device PD1 can be increased, and the read current (Iread) of one first pull-down device PD1 can also be improved, so as to improve the read speed of the first pull-down device PD1. Except for the features mentioned above, the other components, material properties, and manufacturing method of this embodiment are similar to the first preferred embodiment detailed above (it can also refer to FIG. 2) and will not be redundantly described.

Figure 8:
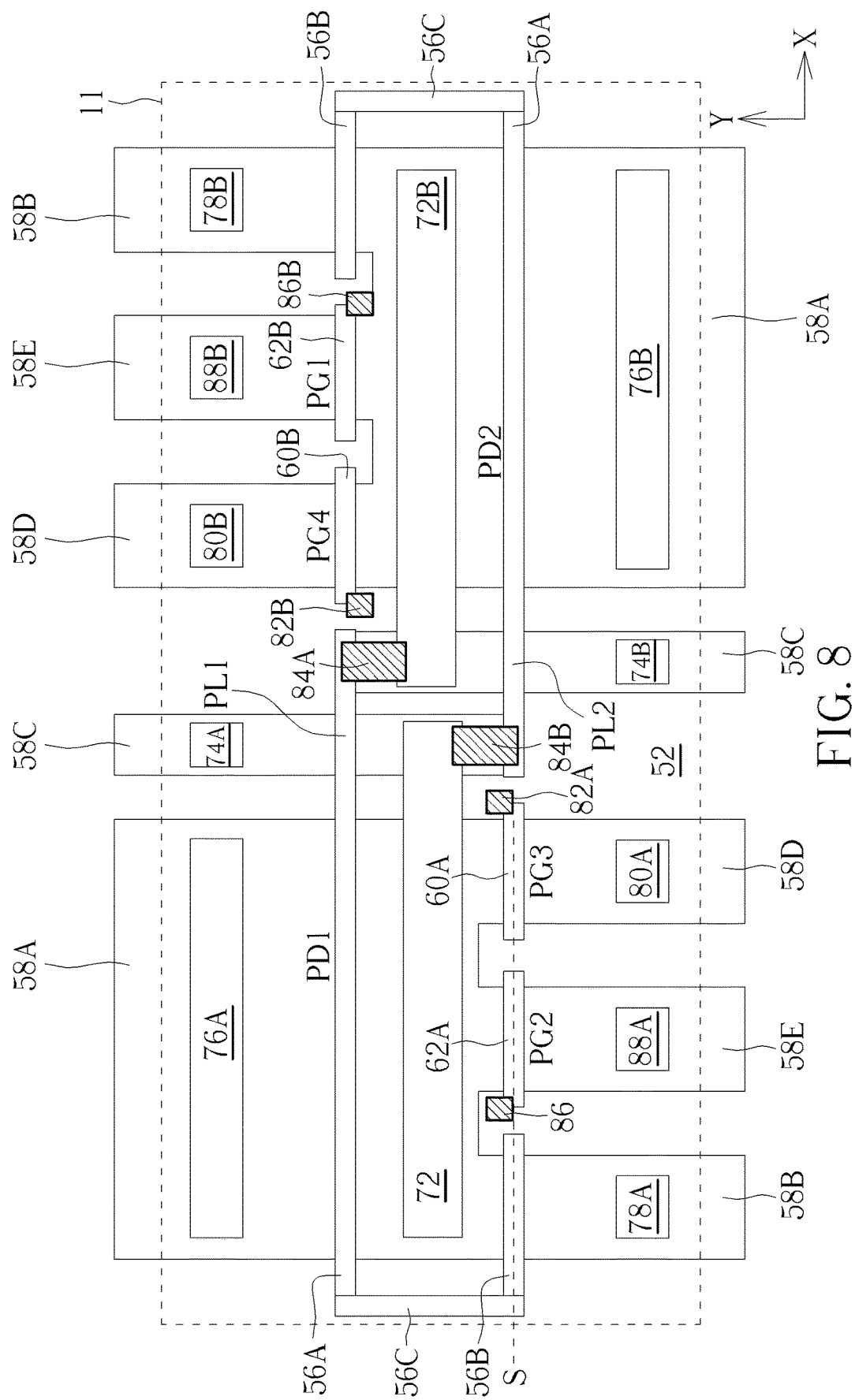
FIG. 8 illustrates a layout diagram of an 8T-SRAM according to another preferred embodiment of the present invention.

Similarly, in the layout pattern of the 8T-SRAM of the second preferred embodiment (please refer to FIG. 6), the planar transistors can be used to replace the finFET too. Please refer to FIG. 8. FIG. 8 illustrates a layout diagram of an 8T-SRAM according to another preferred embodiment of the present invention. In this embodiment, the fin structures are not formed, and two symmetrically arranged first diffusion regions 58A, two symmetrically arranged second diffusion regions 58B, two symmetrically arranged third diffusion regions 58C, two symmetrically arranged fourth diffusion regions 58D and two symmetrically arranged fifth diffusion regions 58E are formed in the substrate 52 through an ion implantation process. Next, similar to the processes mentioned in the second preferred embodiment, the J-shaped structures 56, the first pass gate structures 60A, 60B, the second pass gate structures 62A, 62B, the extending contact structures 72A, 72B, and a plurality of contact structures (including the contact structures 74A, 74B, 76A, 76B, 78A, 78B, 80A, 80B, 82A, 82B, 84A, 84B, 86A, 86B, 88A and 88B) are formed. The J-shaped structure 56 is disposed on the first diffusion region 58A and on the second diffusion region 58B, the first pass gate structure 60A is disposed on the fourth diffusion region 58D, the second pass gate structure 62A is disposed on the fifth diffusion region 58E. In this embodiment, the gate of the first pull-down device PD1 includes the J-shaped structure 56, the long part 56A of the J-shaped structure 56 is disposed on the first diffusion region 58A, the short part 56B of the J-shaped structure 56 is disposed on the second diffusion region 58B. Therefore, this embodiment has the same advantage as the one in the first preferred embodiment: the channel width of the first pull-down device PD1 can be increased, and the read current (Tread) of one first pull-down device PD1 can also be improved, so as to improve the read speed of the first pull-down device PD1. Except for the features mentioned above, the other components, material properties, and manufacturing method of this embodiment are similar to the second preferred embodiment detailed above (it can also refer to FIG. 6) and will not be redundantly described.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A layout pattern of a static random access memory, comprising:
   a first inverter and a second inverter cross-coupled for data storage, each inverter including a pull-up device (PL1) and a pull-down device (PD1);
   each inverter comprising a J-shaped gate structure disposed on a substrate, the J-shaped gate structure comprising a first part and a second part arranged along a first direction, and a bridge part connected to the first part and the second part, the bridge part is arranged along a second direction, wherein the first direction is perpendicular to the second direction, the first direction and the second direction are directions parallel to a surface of the substrate, and wherein the first part crosses over a first fin structure, and the second part crosses over a second fin structure to form the pull-down device (PD1), wherein the first part crosses over a third fin structure to form the pull-up device (PL1);
   each inverter has an inverter output, the inverter output connecting a first pass gate device (PG1) disposed on the substrate, a gate of the first pass gate device and the second part of the J-shaped gate structure being arranged along the first direction and comprising a same symmetry axis, wherein the gate of the first pass gate device crosses over a fourth fin structure to form the first pass gate device (PG1); and
   each inverter output comprising an extending structure disposed between the first part and the second part of the J-shaped gate structure, and disposed between the bridge part and the gate of the first pass gate device, wherein the bridge part of the J-shaped gate structure is not overlapped with the extending structure, and wherein the continuous extending structure crosses over the first fin structure, the second fin structure, the third fin structure and the fourth fin structure.

2. The layout pattern of claim 1, each inverter output further connecting a second pass gate device disposed on the substrate, a gate of the second pass gate device and the second part of the J-shaped gate structure being arranged along the first direction and comprising a same second symmetry axis, wherein the gate of the second pass gate device crosses over a fifth fin structure to form the second pass gate devices.

3. The layout pattern of claim 2, wherein said extending structure is disposed between the first part of the J-shaped gate structure and the gate of the second pass gate device.

4. The layout pattern of claim 1, wherein the second part is disposed between the bridge part and the gate of the first pass gate device.

5. The layout pattern of claim 1, wherein the layout pattern of the static random access memory (SRAM) is disposed within a specific range, the specific range has an edge, and the bridge part is disposed adjacent to the edge.

6. The layout pattern of claim 5, wherein the first pass gate device is not in between the edge of the specific range and the bridge part of the J-shaped structure.

7. The layout pattern of claim 5, wherein the first fin structure, the second fin structure, the third fin structure and the fourth fin structure are parallelly arranged within the specific range at pitch.

8. The layout pattern of claim 1, wherein the bridge part comprises a dielectric layer and a metal electrode.

9. The layout pattern of claim 1, wherein the first pass gate device of the first inverter is horizontally arranged between the pull-down device of the first inverter and the pull-up device of the second inverter.

10. A layout pattern of a static random access memory, comprising:
    a first inverter and a second inverter cross-coupled for data storage, each inverter including a pull-up device (PL1) and a pull-down device (PD1);
    each inverter comprising a J-shaped gate structure disposed on a substrate, the J-shaped gate structure comprising a first part and a second part arranged along a first direction, and a bridge part connected to the first part and the second part, the bridge part is arranged along a second direction, wherein the first direction is perpendicular to the second direction, the first direction and the second direction are directions parallel to a surface of the substrate, and wherein the first part crosses over a first diffusion region, and the second part crosses over a second diffusion region to form the pull-down device (PD1), wherein the first part crosses over a third diffusion region to form the pull-up device (PL1);
    each inverter has an inverter output, the inverter output connecting a first pass gate device (PG1) disposed on the substrate, a gate of the first pass gate device and the second part of the J-shaped gate structure being arranged along the first direction and comprising a same symmetry axis, wherein the gate of the first pass gate device crosses over a fourth diffusion region to form the first pass gate device (PG1); and
    each inverter output comprising an extending structure disposed between the first part and the second part of the J-shaped gate structure, and disposed between the bridge part and the gate of the first pass gate device, wherein the bridge part of the J-shaped gate structure is not overlapped with the extending structure, and wherein the continuous extending structure crosses over the first diffusion region, the second diffusion region, the third diffusion region and the fourth diffusion region.

11. The layout pattern of claim 10, each inverter output further connecting a second pass gate device disposed on the substrate, a gate of the second pass gate device and the second part of the J-shaped gate structure being arranged along the first direction and comprising a same second symmetry axis, wherein the gate of the second pass gate device crosses over a fifth diffusion region to form the second pass gate devices.

12. The layout pattern of claim 11, wherein said extending structure is disposed between the first part of the J-shaped gate structure and the gate of the second pass gate device.

13. The layout pattern of claim 10, wherein the second part is disposed between the bridge part and the gate of the first pass gate device.

14. The layout pattern of claim 10, wherein the layout pattern of the static random access memory (SRAM) is disposed within a specific range, the specific range has an edge, and the bridge part is disposed adjacent to the edge.

15. The layout pattern of claim 14, wherein the first pass gate device is not in between the edge of the specific range and the bridge part of the J-shaped structure.

16. The layout pattern of claim 14, wherein the first diffusion region, the second diffusion region, the third diffusion region and the fourth diffusion region are parallelly arranged within the specific range at pitch.

17. The layout pattern of claim 10, wherein the bridge part comprises a dielectric layer and a metal electrode.

18. The layout pattern of claim 10, wherein the first pass gate device of the first inverter is horizontally arranged between the pull-down device of the first inverter and the pull-up device of the second inverter.

* * * * *